United States Patent [19]

Iranmanesh et al.

[11] Patent Number: 5,302,551
[45] Date of Patent: Apr. 12, 1994

[54] METHOD FOR PLANARIZING THE SURFACE OF AN INTEGRATED CIRCUIT OVER A METAL INTERCONNECT LAYER

[75] Inventors: Ali Iranmanesh, Sunnyvale; John M. Pierce, Palo Alto, both of Calif.

[73] Assignee: National Semiconductor Corporation, Santa Clara, Calif.

[21] Appl. No.: 880,880

[22] Filed: May 11, 1992

[51] Int. Cl.$^5$ .................................................. H01L 21/44
[52] U.S. Cl. ..................................... 437/195; 437/194; 437/199; 437/228; 156/643; 156/653
[58] Field of Search .............. 437/194, 195, 228, 199; 156/643, 645, 653, 657

[56] References Cited

U.S. PATENT DOCUMENTS

| | | |
|---|---|---|
| 3,863,395 | 2/1975 | Brown . |
| 4,475,981 | 10/1984 | Rea . |
| 4,671,851 | 6/1987 | Beyer et al. . |
| 4,702,792 | 10/1987 | Chow et al. . |
| 4,758,306 | 7/1988 | Cronin et al. . |
| 4,789,648 | 12/1988 | Chow et al. ........................ 437/195 |
| 4,818,725 | 4/1989 | Lichtel, Jr. et al. . |
| 4,824,521 | 4/1989 | Kulkarni et al. . |
| 4,824,793 | 4/1989 | Richardson et al. . |
| 4,839,311 | 6/1989 | Riley et al. . |
| 4,849,369 | 7/1989 | Jeuch et al. ........................ 437/195 |
| 4,879,257 | 11/1989 | Patrick ................................ 437/195 |
| 4,894,351 | 1/1990 | Batty ................................... 437/195 |
| 4,910,155 | 3/1990 | Cote et al. ............................. 437/8 |
| 4,944,836 | 7/1990 | Beyer et al. . |
| 4,954,142 | 9/1990 | Carr et al. . |
| 4,966,867 | 10/1990 | Crotti et al. ........................ 437/195 |
| 4,997,781 | 3/1991 | Tigelaar . |
| 5,006,485 | 4/1991 | Villalon ............................... 437/195 |
| 5,028,553 | 7/1991 | Esquivel et al. . |
| 5,032,881 | 7/1991 | Sardo et al. . |
| 5,065,273 | 11/1991 | Rajeevakumar . |
| 5,081,516 | 1/1992 | Haskell . |
| 5,091,340 | 2/1992 | Mizushima ......................... 437/194 |
| 5,110,763 | 5/1992 | Matsumoto ........................ 437/195 |

OTHER PUBLICATIONS

Stanley Wolf, *Silicon Processing for the VLSI Era vol. 2: Process Integration*, Lattice Press, Sunset Beach, Calif. 1990.

Ghandhi, *VLSI Fabrication Principles*, Wiley-Interscience Publication New York, N.Y., 1983 p. 432.

Kaufman et al., "Chemical-Mechanical Polishing for Fabricating Patterned W Metal Features as Chip Interconnects" J. Electrochem Soc. vol. 138 No. 11 Nov. 1991 pp. 3460–3465.

Patrick et al. "Application of Chemical Mechanical Polishing to the Fabrication of VLSI Circuit Interconnections" J. Electrochem. Soc. vol. 138 No. 6 Jun. 1991 pp. 1778–1784.

*Primary Examiner*—Brian E. Hearn
*Assistant Examiner*—Kevin M. Picardat
*Attorney, Agent, or Firm*—Townsend and Townsend Khourie and Crew

[57] ABSTRACT

A method is provided for planarizing the surface of an integrated circuit over a metal interconnect layer. Metal interconnect lines and surrounding regions of a partially fabricated integrated circuit are first coated with a thin layer of dielectric substantially free of voids and then coated with a polysilicon layer. The polysilicon layer is planarized back to the level of the dielectric layer on top of the interconnects, providing a substantially planar surface for subsequent fabrication steps including deposition of a second dielectric layer and an overlying metal layer.

18 Claims, 1 Drawing Sheet

METHOD FOR PLANARIZING THE SURFACE OF AN INTEGRATED CIRCUIT OVER A METAL INTERCONNECT LAYER

RELATED APPLICATIONS

This application is related to U.S. patent applications Ser. Nos. 07/874,675 and 07/874,493, assigned to the assignee of the present invention and incorporated herein by reference for all purposes. These applications describe planar fabrication methods related to those of the present invention.

BACKGROUND OF THE INVENTION

The present invention lies in the field of semiconductor devices and methods for fabricating semiconductor devices, especially MOS and bipolar devices. More particularly, the present invention lies in the field of methods for forming a planarized surface over a metal interconnect layer.

In modern integrated circuits, multiple metal layers are used for wiring (or "interconnecting") the active transistors to form useful functional circuits. Metal layers are deposited by physical or chemical vapor deposition (PVD or CVD) methods and then etched using a photolithographic mask to form patterns of metal strips which act as wires. In a typical circuit, these strips may be as narrow as the metal layer is thick (e.g., less than 1 $\mu$m), and the gaps between metal strips may be equally narrow. After the metal layer has been etched, the surface of the integrated circuit is not planar, and, in fact, contains many steps as high as the metal thickness and separated by comparable distances.

In order to continue the fabrication process, the surface containing the metal strips must be covered by a layer of suitable dielectric material to insulate the metal interconnect strips from the next layer of metal. Holes or vias are then cut in the dielectric layer where vertical interconnections are desired between the metal layers. Unfortunately, present dielectric deposition techniques, such as CVD or plasma enhanced CVD (PECVD), have difficulty covering steps conformally and often do not adequately fill the narrow slots between closely spaced metal lines. Thus, undesirable voids may be left in these slots. Further, even if no voids are left, the upper surface of the deposited dielectric will have steps of height comparable to that of the metal interconnect runners. These height variations will make it difficult to obtain consistent focus and complete exposure in subsequent photolithography steps. In addition, the ridges and valleys on the dielectric surface are difficult to cover with metal for the next interconnect layer.

To address these problems, the current art has developed several planarization techniques to smooth the surface of dielectric layers over patterned metal layers. For example, spin-on-glass (SOG) or (sol-gel technology) is one widely-used method used to fill narrow gaps without leaving voids. In this method, a thin dielectric layer is deposited by CVD and then a liquid material (which forms the glass) is spun on the surface. This liquid fills the narrow gaps and converts sharp steps to more gently sloping ones. After it hardens, the SOG is often partially etched back to minimize the amount of SOG left on the wafer, and then covered by a second CVD glass layer. Unfortunately, SOG materials are porous and tend to absorb water. In addition, they do not produce a planar wafer surface, having height variations as great as the thickness of the underlying metal layer. This height differential builds up as each metal layer is added, causing increasing difficulty in lithography.

Another previous method involves steps of first depositing a dielectric layer over the metal lines followed by steps of spinning an organic layer such as photoresist over the rough dielectric layer and etching back the composite layer using an etch process which attacks the dielectric and the organic at the same rate. This method requires a dielectric deposition method capable of filling the gaps between metal lines, as no organic can be left on the wafer. Unfortunately, this method also leaves steps on the surface similar to those left by a SOG process.

Still another method uses chemical-mechanical polishing (CMP) to planarize the dielectric layer over metal strips. This technique is discussed in detail in the following U.S. patent applications which are incorporated herein by reference for all purposes: U.S. Ser. No. 07/874,675 and U.S. Ser. No. 07/874,493. CMP is particularly desirable because it provides "global planarization." In other words, the leveling lengths provided by CMP are so great that even widely spaced steps (i.e. steps that are approximately 1 mm apart) on typical integrated circuits are eliminated. However, applying CMP to a dielectric layer over metal strips has certain disadvantages. First, polishing dielectrics such as silicon dioxide used as insulators in integrated circuits is relatively slow and expensive. Second, in cases where the underlying metal lines are made of a soft metal such as aluminum, CMP can damage the metal. This second problem could be alleviated if effective polish stopping materials capable of protecting the metal lines from attack were known. A thin layer of such materials could be used to coat the interconnect lines before the main dielectric layer was formed. Unfortunately, no such materials are known that also offer high resistance to a dielectric CVD process and are otherwise compatible with integrated circuit processing. Thus, the CMP step must be carefully controlled to ensure that the metal interconnects are not exposed. This requires that sufficient margin must be built into the fabrication process to accommodate this lack of control. In some instances, this can be accomplished by increasing the thickness of the dielectric layer.

Thus, it is seen that improvements are still needed in the fabrication procedures for interconnect layers in various integrated circuit devices.

SUMMARY OF THE INVENTION

The present invention provides an improved method for planarizing the surface of an integrated circuit over a metal interconnect layer. It employs a polysilicon (or a related polycrystalline semiconductor material) layer as a planarization material because polysilicon is superior in many ways to the glasses and dielectrics previously used for planarization. Chemical-mechanical polishing (CMP) or another suitable process is used to planarize the polysilcon layer to near the level of the tops of the metal interconnects. A thin layer of dielectric will be deposited on the interconnects to act as a polishing stop, thus minimizing the danger of damaging the interconnect runners.

In a preferred embodiment, integrated circuits of the present invention are characterized by the following features. A layer of metal interconnects will be present on the surface of an underlying substrate. The substrate will typically be a partially fabricated integrated circuit having a plurality of partially fabricated semiconductor devices thereon. The substrate and metal interconnects are covered by a first dielectric layer that substantially follows the profile of the underlying interconnect and substrate. Thus, the first dielectric layer has upper dielectric surfaces over the interconnects and lower dielectric surfaces over the substrate, with the distance separating the upper and lower dielectric surfaces being approximately the same magnitude as the height of the interconnects. In some embodiments, the upper dielectric surfaces are substantially coplanar with one another. A plurality of polycrystalline semiconductor plugs cover the first dielectric layer in the regions between the interconnects. The plugs each terminate in upper surfaces that are, in some embodiments, substantially coplanar with the upper dielectric surfaces. Thus, a planar surface (consisting of polycrystalline semiconductor plugs and dielectric layer upper surfaces) is provided for a second dielectric layer.

A preferred method for forming a planarized surface over an interconnect layer according to the present invention involves first forming interconnect lines on the surface of a partially fabricated integrated circuit. Next a dielectric layer is conformally deposited over the interconnects and the exposed regions of the surface of the partially fabricated integrated circuit. The dielectric layer will have upper and lower surfaces that generally correspond to the locations of the interconnects and exposed portions of the integrated circuit, respectively. As with the device described above, the upper surfaces of the dielectric layer may be substantially coplanar with one another. Next, a layer of polycrystalline semiconductor is deposited over the dielectric layer and planarized to about the level of the upper surfaces of the dielectric layer. This produces a series of polycrystalline semiconductor plugs separated from one another by the interconnects (and the associated dielectric layer). The upper surfaces of the polycrystalline semiconductor plugs will, in some embodiments, be substantially coplanar with the upper dielectric surfaces.

A further understanding of the nature and advantages of the inventions herein may be realized by reference to the remaining portions of the specification and the attached drawings.

DESCRIPTION OF THE SPECIFIC EMBODIMENT

The method of this invention makes use of the fact that CMP processes can be optimized to remove polycrystalline silicon, germanium, and silicon/germanium alloys (poly) several times faster than they remove dielectrics such as silicon dioxide and silicon nitride. For example, polishing rate ratios of polysilicon to silicon dioxide are often of the order of 100:1. Such selectivity can be achieved while maintaining high removal rates for poly. In addition, the present invention makes use of the fact that CVD techniques can produce very conformal poly films that fill narrow gaps such as those between closely spaced metal lines on integrated circuits. Chemically and physically, poly is compatible with integrated circuit fabrication technology, and may therefore be substituted for the dielectric layer typically formed between interconnect layers, provided that another form of insulation is present.

Figure 1:
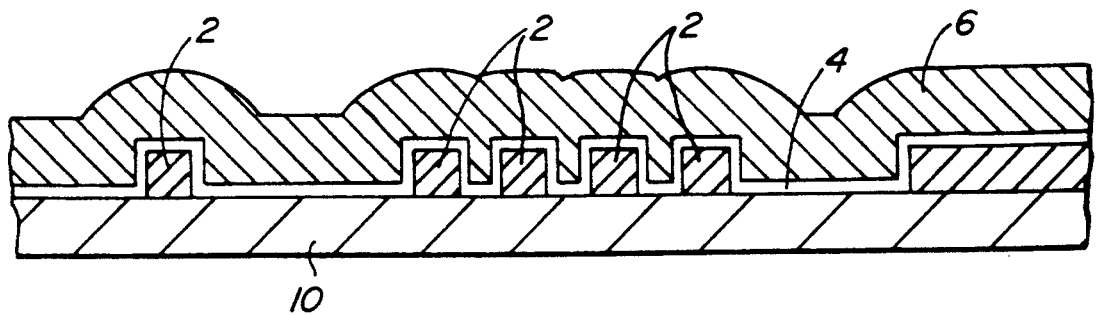
FIG. 1 displays a partially fabricated integrated circuit according to the present invention in which layers of dielectric and polysilicon conformally cover interconnect runners on a substrate.
Figure 2:
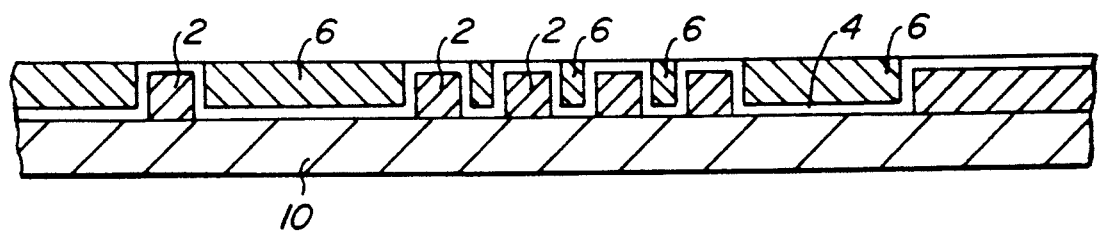
FIG. 2 displays the structure represented in FIG. 1 after the polysilicon layer has been planarized to the level of dielectric surfaces on the interconnect runners.
Figure 3:
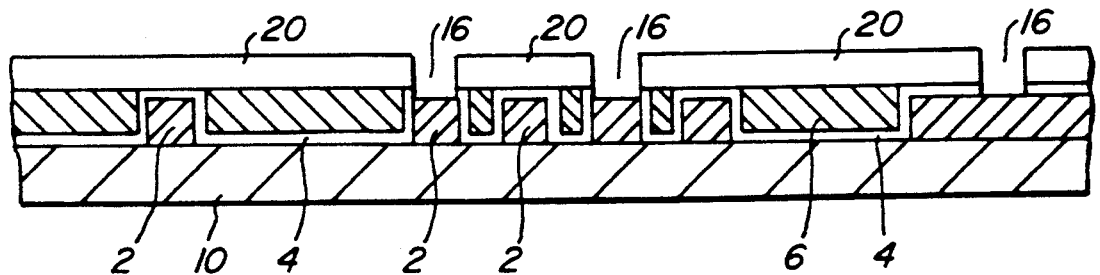
FIG. 3 displays the device represented in FIG. 2 after it has been covered with a conformal layer of dielectric and etched to form vertical interconnects vias.

The method of this invention is represented in FIGS. 1-3. A metal layer is deposited on substrate 10 and patterned to define metal interconnect lines 2. A thin layer of dielectric 4 is then deposited over the metal lines as shown in FIG. 1. This layer is typically silicon dioxide, but it could also be silicon nitride, or a doped glass of which several are known in the art. The dielectric layer 4 must be thick enough to act as an effective stopping layer for the subsequent CMP step but thin enough to avoid closing over gaps between closely spaced metal lines to leave voids. Exact limits on this thickness will depend on the design of the circuit and the characteristics of the various processes involved as is known to those of skill in the art. For most applications, a thickness in the range 50–500 nm is appropriate. Preferably, a thickness of 200–500 nm will be used. If the underlying surface of substrate 10 (on which the interconnects are formed) is planar, surface regions of dielectric layer 4 over the interconnects will, in general, be substantially coplanar.

According to this invention, a poly layer 6 is next deposited using a conformal CVD or PECVD process. To ensure that the grooves between metal lines are completely filled, this layer is made approximately 0–100% thicker than the underlying metal layer. The exact poly layer composition is adjusted to be compatible with the underlying metal and to provide the desired electrical properties. If the underlying interconnects are made from a refractory metal such as tungsten which can tolerate temperatures in the 550°–650° C. range, the poly layer can be polysilicon formed by CVD using silane as a source gas. For structures incorporating interconnect metals such as aluminum which require lower temperature processing, germanium or a germanium-silicon alloy may be preferable. Polycrystalline germanium can be deposited at useful rates by CVD from GeH4 at temperatures below 400° C. Unfortunately, nucleation of germanium films on oxide surfaces is often poor. By mixing SiH4 and GeH4, silicon/germanium alloys can be deposited, thus improving nucleation on oxide. Other means of improving nucleation of poly films with high germanium content include first depositing a silicon nucleation layer by CVD or other means such as sputtering.

Poly is not, of course, as good a dielectric as silicon dioxide for example (even when the poly is undoped), but it can have a resistivity which is high enough to provide useful electrical isolation between circuit elements. In addition, oxygen can be deliberately added to the poly in low percentages to further increase the resistivity, as is known in the art.

After the poly has been deposited, its surface is planarized by CMP or another suitable process to produce the surface shown in FIG. 2. The CMP process is stopped when the thin dielectric on top of the metal lines is exposed. The deposited poly layer is thus converted to one or more regions or plugs separated by the interconnect lines. In some embodiments, the upper surfaces of these poly regions will be substantially coplanar with the dielectric surfaces on top of the interconnect lines.

Because the dielectric removal rate of a suitably optimized CMP process is slow compared to that of poly, and because the stiffness of the polishing pad used in the CMP tool tends to equalize removal rates laterally over the device, polishing essentially stops when dielectric is exposed, leaving a globally planar surface. Thus, the top surface of the poly remaining in areas between metal lines is coplanar with that of the dielectric over the metal as shown in FIG. 2. CMP techniques known in the art are sufficient to ensure that poly-filled areas up to 1 mm in width are leveled.

Chemical-mechanical polishing is a preferred planarization process because, among other reasons, it provides global planarization, i.e. the leveling lengths are significantly wider (of order millimeters rather than micrometers) than those of other techniques. Thus, even widely spaced steps on typical integrated circuits are eliminated. When CMP is performed on a conformally deposited poly layer as described above, it has been found that the step size after planarization is typically smaller than 0.1 micrometers and preferably smaller than 0.05 micrometers. This is a substantial reduction over the 0.1-1.0 micrometer range of step sizes initially present on the poly surface.

For CMP processes, a polishing pad and a slurry of abrasive particles in a chemically active media are preferably used. It has been found that for polysilicon, a colloidal silica slurry in an alkaline aqueous medium is suitable. A preferred slurry is Nalco 2354, manufactured by Nalco Chemical Company, Chicago, Ill. This slurry is diluted for use in a ratio of 20 parts water to 1 part concentrated slurry. The pH of the diluted mixture is approximately 10. Any of a number of other slurry formulations used for polishing silicon wafers are also suitable for planarizing poly. For other materials, different combinations of abrasive particles and chemically active media are appropriate.

A variety of polishing pads may be employed depending upon the material to be polished and the slurry employed. Generally, any polishing pad commonly used in the silicon wafer polishing industry can be used with the present invention to polish polysilicon layers. Preferably, the polishing pads will be made from polyurethane impregnated polyester felt such as the SUBA series pads, manufactured by Rodel, Inc., Scottsdale, Ariz. A particularly preferred pad for the use in polishing polysilicon with the aforementioned slurries is SUBA 500. For other material and slurry combinations, different pad materials may be required. In each instance, however, the pad should resist chemical attack by the slurry, provide a suitable balance of rigidity and conformability to the wafer surface, and provide suitable polishing rates in combination with the slurry.

The apparatus used to accomplish the polishing step according to this invention can be any machine capable of pressing the wafer against a moving polishing pad in the presence of slurry with a pressure of less than about 30 psi and preferably in the range of about 1-15 psi. Such machines are commonly used for polishing silicon wafers and other materials. A preferred machine for this purpose is the Model 572 polisher, manufactured by Westech Systems, Inc., Phoenix, Ariz. With this machine, a preferred set of conditions for polishing polysilicon with colloidal silica slurry and a SUBA 500 pad are the following: 100 rpm, wafer carrier rotation rate 100 rpm, 115° F. pad platen rotation rate contact pressure 150 ml/min, slurry flow 5 psi, pad surface temperature.

As mentioned, it is desirable to use a polishing method that exhibits a large difference in the rate of polishing the polysilicon and the rate of polishing the dielectric layer (such as silicon dioxide or silicon nitride). Polishing conditions that favor a large polishing rate differential include reduced solids content in the slurry, higher slurry pH, and higher pad temperature during polishing. For the conditions described in the preceding paragraphs, the ratio of polysilicon to silicon dioxide removal rates is approximately 100:1. If silicon nitride is used as a polishing stop, the ratio can, in some instances be even greater than 100:1.

An alternative planarization method which can be used in the present invention involves applying and curing a liquid on the substrate surface, and etching it back. The liquid, which is typically cured, hardens into a solid film providing a level upper surface. Typically, the liquid will be a spin coated organic polymer, and more typically a photoresist. The photoresist will have an average thickness of approximately 1 $\mu$m and may be smoothed by suitable heat treatment. The resulting surface, including the hardened liquid, is then etched such that the film material and the poly are removed at the same rate. If the etch is stopped at the optimum point, the leveling effect of the liquid is transferred to the poly. Still other planarization methods that will be apparent to those of skill in the art may be employed.

After the poly layer has been planarized as described, a second layer of dielectric 20 is deposited over the planar surface of the device as shown in FIG. 3. Vias 16 are then cut through both layers of dielectric to the metal lines without exposing any poly. During this process, it is necessary to ensure that certain design rules, such as those requiring that vias are contained entirely within the width of the underlying metal line are followed. Design rules of this sort are commonly used to "over engineer" a process, thus minimizing the possibility of device failure. If such design rules are not imposed, metal and poly may come in contact, in which case suitable barrier metallurgies may, in some cases, be used to prevent undesirable interactions.

Finally, the vias are filled with conductive material to make electrical contact with an overlying metal layer. This layer may be formed when the vias are filled or afterwards. In either case, it is then patterned and etched as necessary to produce the necessary wiring for the desired integrated circuit. These steps are made simpler because the underlying interconnect layer has been planarized. Any subsequent fabrication steps are also improved by the preceding planarization step.

Although the discussion has focused on certain preferred embodiments of the present invention, some variations of the process will be apparent to those skilled in the art. For example, if the resistivity of the poly layer is high enough for the circuit design in question and if the metal to be deposited over the second dielectric layer is compatible with poly, the second layer of dielectric can be omitted entirely. Similarly, if the overlying metal is compatible with poly, certain vias can be cut directly over poly areas to contact them directly, thus forming new circuit elements such as resistors. The geometry of these elements would be defined by the first metal interconnect pattern. If the metal used for the first interconnect layer is highly resistant to the CMP process, and if it is compatible with poly, the first dielectric layer can be omitted. This will leave first metal lines buried in a matrix of highly resistive poly, which could be advantageous in some circuit designs. These and other modifications are intended to be included within the scope of the claims appended hereto.

What is claimed is:

1. A method of forming a planarized surface over an interconnect layer, said method comprising the following steps:
   forming interconnect lines on a surface of a partially fabricated integrated circuit;
   conformally depositing a dielectric layer over the interconnects and exposed regions of the surface of said partially fabricated integrated circuit, said dielectric layer having upper dielectric surfaces over the interconnects and lower dielectric surfaces over the partially fabricated integrated circuit;
   depositing a layer of poly over said dielectric layer; and
   planarizing the layer of poly to at least about the level of the upper surfaces of said dielectric layer, wherein after planarization, said layer of poly is composed of a plurality of regions separated by said interconnect lines.

2. The method recited in claim 1 wherein said surface of a partially fabricated integrated circuit substrate on which the interconnect lines are formed in substantially planar and wherein said plurality of poly regions have upper surfaces that are substantially coplanar with said upper dielectric surfaces.

3. The method recited in claim 1 wherein said poly is selected from the group consisting of doped and undoped polysilicon, doped and undoped polycrystalline germanium, and combinations thereof.

4. The method recited in claim 1 wherein said interconnect is made from a material selected from the group consisting of aluminum, tungsten, and alloys thereof.

5. The method recited in claim 4 wherein said interconnect material is aluminum and said poly layer includes polycrystalline germanium.

6. The method recited in claim 4 wherein said interconnect material is tungsten and said poly layer is polysilicon.

7. The method recited in claim 1 wherein said polycrystalline semiconductor is planarized by chemical-mechanical polishing.

8. The method recited in claim 7 wherein the chemical-mechanical polishing is conducted with an alkaline slurry of silica particles.

9. The method recited in claim 1 wherein said polycrystalline semiconductor is doped with oxygen to reduce its conductivity.

10. The method recited in claim 1 further comprising a step of depositing a second dielectric layer over the upper polycrystalline semiconductor and dielectric surfaces.

11. The method as recited in claim 10 further comprising the following steps:
    forming a plurality of vias in said second dielectric layer;
    depositing an overlying metal layer; and
    electrically connecting some regions of said interconnects with an overlying layer.

12. A method of forming a planarized surface over an interconnect layer, said method comprising the following steps:
    depositing a layer of conductive material on a substantially planar surface of a partially fabricated integrated circuit;
    patterning and etching said layer of conductive material to form interconnect lines;
    conformally depositing a first dielectric layer over the interconnects and exposed regions of said substantially planar surface of the partially fabricated integrated circuit, said first dielectric layer having upper dielectric surfaces over the interconnects and lower dielectric surfaces over the partially fabricated integrated circuit, said upper surfaces being substantially coplanar with each other;
    depositing a layer of poly over the surface of the first dielectric layer;
    planarizing the poly layer to produce a partially fabricated device having a planar surface substantially free of steps; and
    forming an overlying metal layer.

13. The method of claim 12 wherein the layer of poly is deposited by chemical vapor deposition.

14. The method of claim 12 wherein the step of planarizing the layer of poly includes chemical-mechanical polishing.

15. The method of claim 12 further comprising a step of depositing a second dielectric layer over the surface before the overlying metal layer is formed.

16. A method of forming a planarized surface over an interconnect layer, the method comprising the following steps:
    forming interconnect lines on a surface of a partially fabricated integrated circuit;
    conformally depositing a dielectric layer over the interconnects and exposed regions of the surface of the partially fabricated integrated circuit, the dielectric layer having upper dielectric surfaces over the interconnects and lower dielectric surfaces over the partially fabricated integrated circuit;
    depositing by chemical vapor deposition a layer of poly over the dielectric layer; and
    planarizing the layer of poly by chemical-mechanical polishing to at least about the level of the upper surfaces of the dielectric layer, wherein after planarization, said layer of poly comprises a plurality of poly regions separated by the interconnect lines.

17. The method of claim 16 wherein the chemical-mechanical polishing rates ratio of poly to dielectric is about 100:1 or greater.

18. The method of claim 16 wherein the conformally deposited dielectric layer is selected from the group consisting of silicon oxides and nitrides.

* * * * *